US010269872B2

United States Patent
Sung et al.

(10) Patent No.: US 10,269,872 B2
(45) Date of Patent: Apr. 23, 2019

(54) DISPLAY APPARATUS

(71) Applicant: Samsung Display Co., Ltd., Yongin-si (KR)

(72) Inventors: Eunjin Sung, Yongin-si (KR); Jongin Baek, Yongin-si (KR); Byeonghee Won, Yongin-si (KR); Wonsang Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/217,106

(22) Filed: Jul. 22, 2016

(65) Prior Publication Data

US 2017/0200771 A1 Jul. 13, 2017

(30) Foreign Application Priority Data

Jan. 12, 2016 (KR) ........................ 10-2016-0003676

(51) Int. Cl.
*H01L 27/32* (2006.01)
*H01L 51/50* (2006.01)
*H01L 51/52* (2006.01)

(52) U.S. Cl.
CPC ...... *H01L 27/3213* (2013.01); *H01L 27/3246* (2013.01); *H01L 51/5056* (2013.01);
(Continued)

(58) Field of Classification Search
None
See application file for complete search history.

(56) References Cited

U.S. PATENT DOCUMENTS 9,318,537 B2 * 4/2016 Sung ................ H01L 27/3211
2008/0018239 A1 * 1/2008 Matsuda ............... C09K 11/06
313/504

(Continued)

FOREIGN PATENT DOCUMENTS

KR  10-2011-0070176  6/2011
KR  10-2013-0047909  5/2013
(Continued)

OTHER PUBLICATIONS

The European Search Report dated Jul. 14, 2017, issued in European Patent Application No. 16196782.

*Primary Examiner* — Lex H Malsawma
(74) *Attorney, Agent, or Firm* — H.C. Park & Associates, PLC

(57) ABSTRACT

A display apparatus includes a unit pixel comprising a red sub pixel, a green sub pixel, a first blue sub pixel, and a second blue sub pixel. Each of the sub pixels include a first electrode, an intermediate layer comprising an organic emission layer disposed on the first electrode, and a second electrode disposed on the intermediate layer. The first blue sub pixel includes a first intermediate layer including a first blue organic emission layer, the second blue sub pixel includes a second intermediate layer including a second blue organic emission layer, the green sub pixel includes a third intermediate layer including a green organic emission layer, and the red sub pixel includes a fourth intermediate layer including a red organic emission layer. The first intermediate layer and the second intermediate layer have different thicknesses, and the third intermediate layer and the fourth intermediate layer have different thicknesses.

20 Claims, 7 Drawing Sheets

(52) U.S. Cl.
CPC ...... *H01L 51/5072* (2013.01); *H01L 51/5088* (2013.01); *H01L 51/5092* (2013.01); *H01L 51/5265* (2013.01)

(56) References Cited

U.S. PATENT DOCUMENTS

| | | | | |
|---|---|---|---|---|
| 2008/0284324 | A1* | 11/2008 | Chun | H01L 27/3211 |
| | | | | 313/504 |
| 2009/0212692 | A1 | 8/2009 | Hasegawa | |
| 2009/0322215 | A1* | 12/2009 | Sung | H01L 27/3211 |
| | | | | 313/504 |
| 2011/0031876 | A1* | 2/2011 | Park | H01L 51/5265 |
| | | | | 313/504 |
| 2011/0127506 | A1 | 6/2011 | So | |
| 2012/0049726 | A1* | 3/2012 | Yoo | H01L 27/3213 |
| | | | | 313/504 |
| 2012/0223346 | A1* | 9/2012 | Ohsawa | H01L 27/3206 |
| | | | | 257/89 |
| 2013/0105778 | A1* | 5/2013 | Kim | H01L 27/3213 |
| | | | | 257/40 |
| 2013/0105833 | A1 | 5/2013 | Weaver et al. | |
| 2014/0183464 | A1* | 7/2014 | Baek | H01L 27/3213 |
| | | | | 257/40 |
| 2015/0009242 | A1 | 1/2015 | Park | |
| 2015/0187848 | A1* | 7/2015 | Kim | H01L 27/3211 |
| | | | | 257/40 |
| 2015/0188087 | A1* | 7/2015 | Lee | H01L 51/5265 |
| | | | | 257/40 |
| 2017/0077190 | A1 | 3/2017 | Hashimoto et al. | |

FOREIGN PATENT DOCUMENTS

| | | |
|---|---|---|
| KR | 10-2015-0005378 | 1/2015 |
| WO | 2015/178029 | 11/2015 |

* cited by examiner

DISPLAY APPARATUS

CROSS-REFERENCE TO RELATED PATENT APPLICATION

This application claims priority from and the benefit of Korean Patent Application No. 10-2016-0003676, filed on Jan. 12, 2016, which is hereby incorporated by reference for all purposes as if fully set forth herein.

BACKGROUND

Field

One or more embodiments relate to apparatuses, and more particularly, to a display apparatus.

Discussion of the Background

Mobile electronic devices have come into widespread use. Recently, tablet PCs, in addition to small-sized electronic devices such as mobile phones, have been widely used as the mobile electronic devices.

In order to support various functions, the mobile electronic devices include a display apparatus for providing a user with visual information such as images or videos. Recently, as components for driving such display apparatuses have become miniaturized, the size of the display apparatuses in electronic devices has gradually increased. Moreover, a display structure that may be curved to have a predetermined angle from a flat state has been developed.

A conventional display apparatus realizes three colors. However, in this case, it is difficult to variously realize a color under various conditions.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display apparatus configured to generate two blue colors.

Additional aspects will be set forth in the detailed description which follows and, in part, will be apparent from the disclosure, or may be learned by practice of the inventive concept.

Exemplary embodiments provide a display apparatus including a unit pixel, the unit pixel including: a first blue sub pixel including a first intermediate layer, the first intermediate layer including a first blue organic emission layer; a second blue sub pixel including a second intermediate layer, the second intermediate layer including a second blue organic emission layer; a green sub pixel including a third intermediate layer, the third intermediate layer including a green organic emission layer; and a red sub pixel including a fourth intermediate layer, the fourth intermediate layer including a red organic emission layer, wherein each of the first blue sub pixel, the second blue sub pixel, the red sub pixel, and the green sub pixel includes a first electrode and a second electrode, the first intermediate layer, the second intermediate layer, the third intermediate layer, and the fourth intermediate layer respectively disposed interposing the first electrode and the second electrode, and wherein the first intermediate layer and the second intermediate layer have different thicknesses, and the third intermediate layer and the fourth intermediate layer have different thicknesses.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
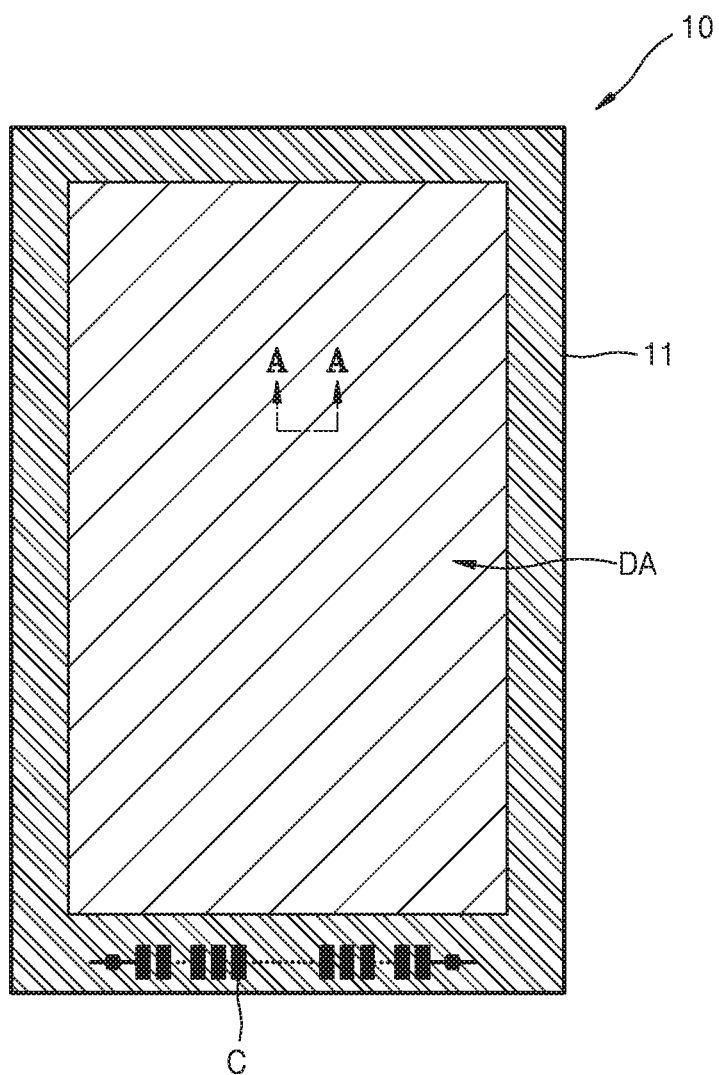
FIG. 1 is a plan view of a display apparatus according to exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
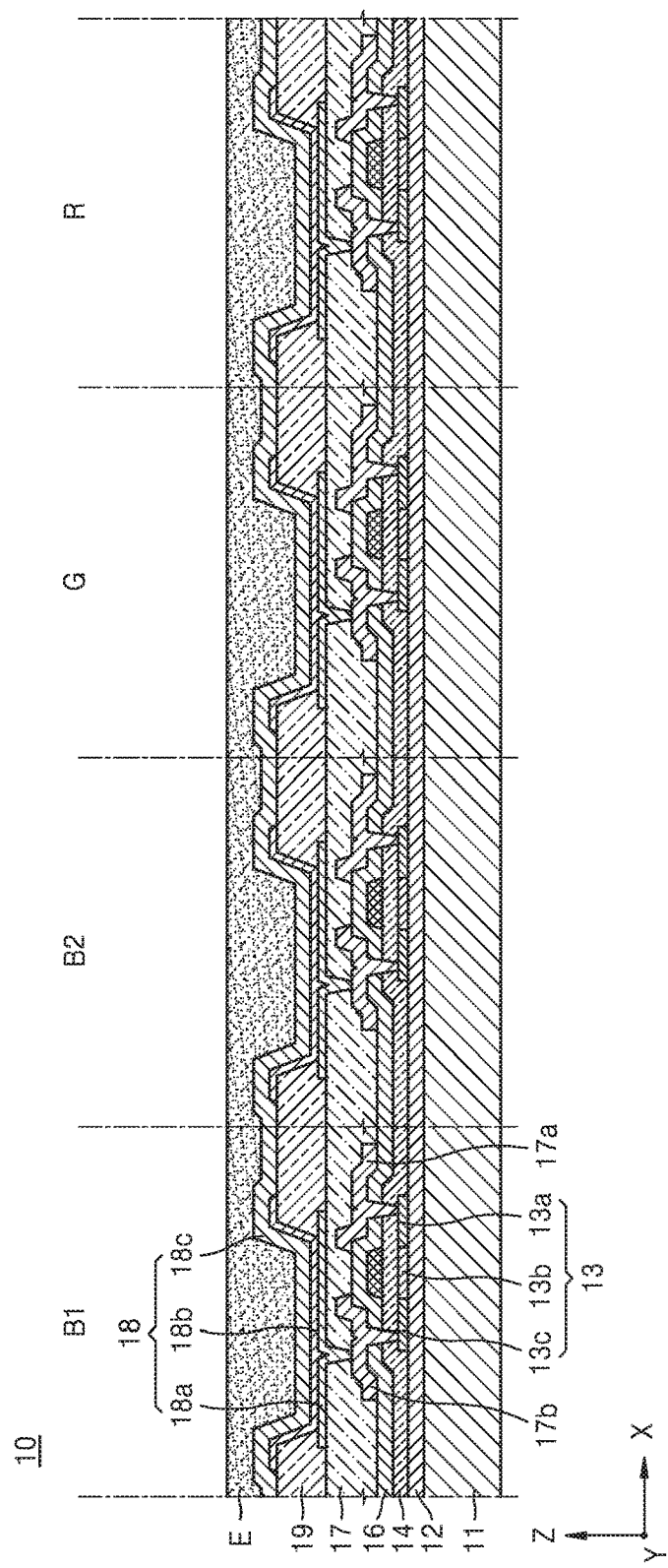
FIG. 2 is a cross-sectional view taken along a sectional line A-A of FIG. 1.

FIG. 1 is a plan view of a display apparatus 10 according to one or more exemplary embodiments. FIG. 2 is a cross-sectional view taken along a sectional line A-A of FIG. 1.

Figure 3:
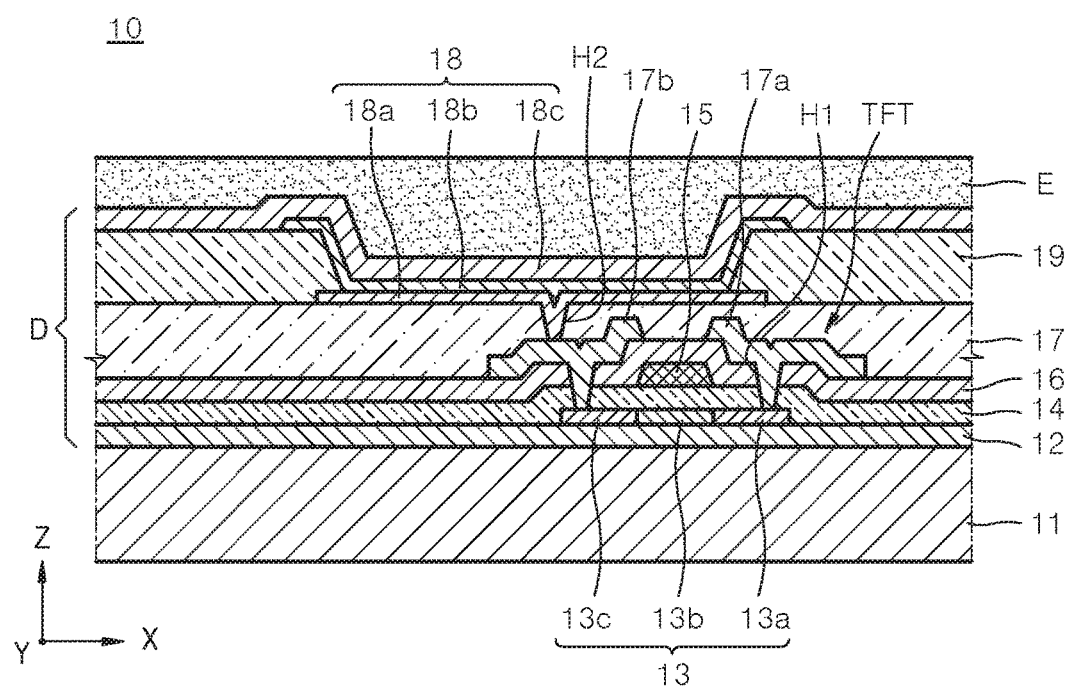
FIG. 3 is a cross-sectional view of a portion of the display apparatus of FIG. 2.
Figure 4:
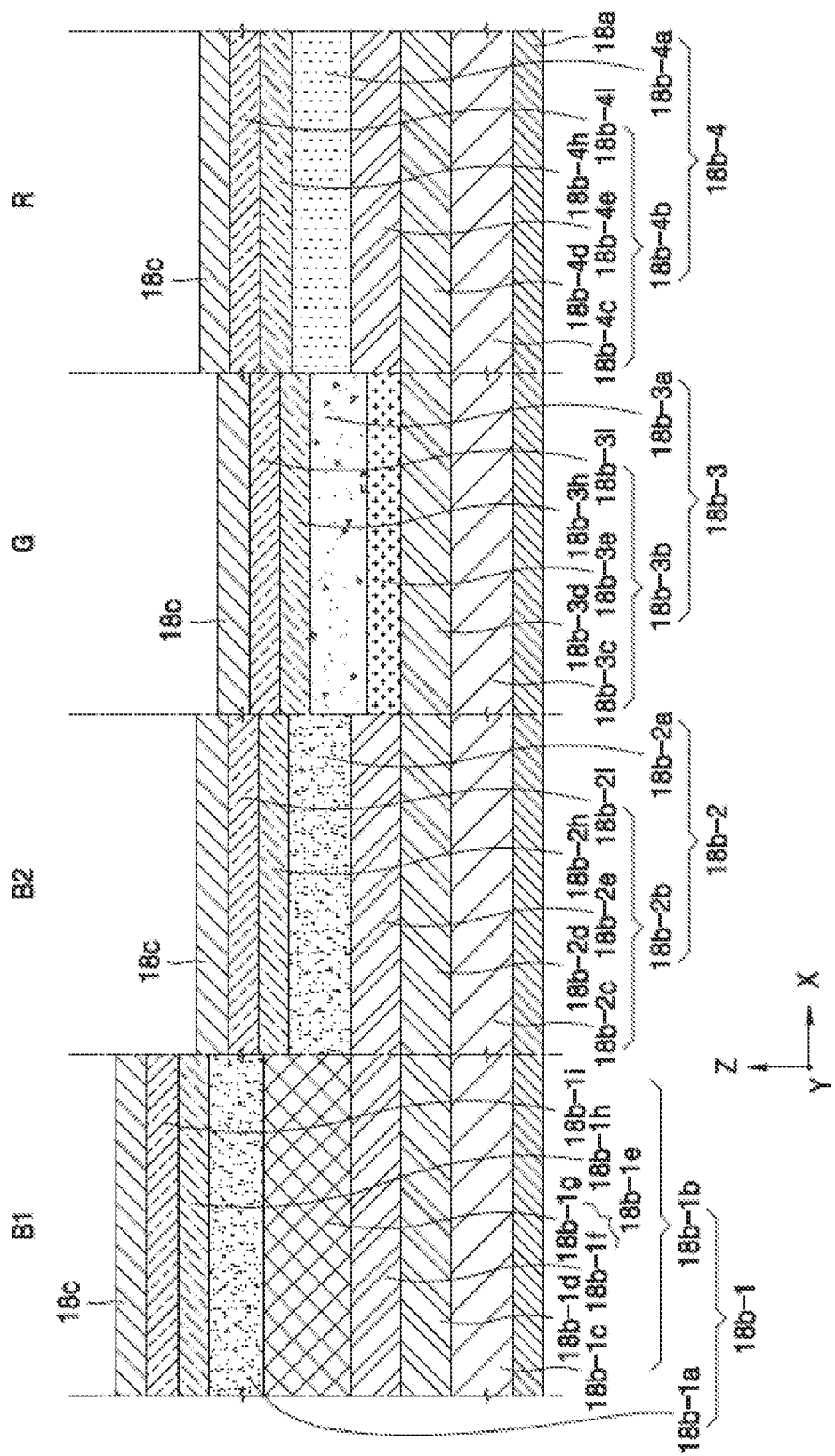
FIG. 4 is a cross-sectional view of an intermediate layer of each sub pixel of the display apparatus of FIG. 1, according to a first exemplary embodiment.

FIG. 3 is a cross-sectional view of a portion of the display apparatus 10 of FIG. 2. FIG. 4 is a cross-sectional view of an intermediate layer of each sub pixel of the display apparatus 10 of FIG. 1, according to a exemplary embodiment.

Referring to FIGS. 1, 2, 3, and 4, the display apparatus 10 may define a display region DA and a non-display region around the display region DA, on a first substrate 11. A light-emission unit D may be disposed in the display region DA, and power wiring (not shown) or the like may be disposed in the non-display region. A pad unit C may be disposed in the non-display region.

The display apparatus 10 may include the first substrate 11 and the light-emission unit D. The display apparatus 10 may also include a thin-film encapsulation layer E or a second substrate formed on an upper surface of the light-emission unit D. The second substrate is the same as or similar to an opposing substrate included in a conventional display apparatus. For convenience of description, the display apparatus 10 including the thin-film encapsulation layer E will now be described in detail.

The light-emission unit D may include a thin film transistor TFT, a passivation layer 17 disposed on the thin film transistor TFT, and an organic light-emitting diode (OLED) 18 disposed on the passivation layer 17.

The first substrate 11 may be formed of a glass material, but exemplary embodiments are not limited thereto. The first substrate 11 may include a plastic material or a metal material, such as, steel use stainless (SUS) or titanium (Ti). Alternatively, the first substrate 11 may include polyimide (PI). For convenience of description, the first substrate 11, including a glass material will now be described in detail.

A buffer layer 12 including an organic compound and/or an inorganic compound is further disposed on the upper surface of the first substrate 11. The buffer layer 12 may include silicon oxide ($SiO_x$) ($x \geq 1$) or silicon nitride ($SiN_x$) ($x \geq 1$).

An active layer 13 arranged in a predetermined pattern is disposed on the buffer layer 12 and is then covered by a gate insulating layer 14. The active layer 13 includes a source region 13a and a drain region 13c and further includes a channel region 13b disposed the source region 13a and the drain region 13c.

The active layer 13 may include various materials. For example, the active layer 13 may include an inorganic semiconductor material such as amorphous silicon or crystalline silicon. The active layer 13 may also include an oxide semiconductor and/or an organic semiconductor material. For convenience of description, the active layer 13 including the amorphous silicon will now be described in detail.

The active layer 13 may be formed by disposing an amorphous silicon layer on the buffer layer 12, crystallizing the amorphous silicon layer to form a polycrystalline silicon layer, and patterning the polycrystalline silicon layer. The source region 13a and the drain region 13c of the active layer 13 are doped with impurities according to a TFT type, such as a driving TFT, a switching TFT, or the like.

A gate electrode 15 is disposed on an upper surface of the gate insulating layer 14 facing the active layer 13, and an interlayer insulating layer 16 is disposed covering the gate electrode 15.

Contact holes H1 are formed in the interlayer insulating layer 16 and the gate insulating layer 14, and a source electrode 17a and a drain electrode 17b are disposed on the interlayer insulating layer 16 such that the source electrode 17a and the drain electrode 17b contact the source region 13a and the drain region 13c, respectively.

The passivation layer 17 is disposed on the thin film transistor TFT formed as described above, and a first electrode 18a of the OLED 18 is disposed on the passivation layer 17. A via hole H2 is formed in the passivation layer 17 and the first electrode 18a contacts the drain electrode 17b of the thin-film transistor TFT through a via hole H2. The passivation layer 17 may be formed of an inorganic material and/or an organic material and may have a single layer structure or a multiple layers structure. The passivation layer 17 may be formed as a planarization layer such that an upper surface thereof is flat regardless of the unevenness of underlying lower layers disposed under the passivation layer 17. Alternatively, the passivation layer 17 may be formed to be uneven according to the unevenness of the underlying lower layer. The passivation layer 17 may include a transparent insulator to generate a resonance effect.

After disposing the first electrode 18a (or pixel electrode) on the passivation layer 17, the pixel-definition layer 19 including an organic material and/or an inorganic material is disposed covering the first electrode 18a and the passivation layer 17. The pixel-definition layer 19 has an aperture exposing the first electrode 18a therethrough.

The intermediate layer 18b and the second electrode 18c (or an opposite electrode) are formed on at least the first electrode 18a.

The first electrode 18a functions as an anode, and the second electrode 18c functions as a cathode. Alternatively, the first electrode 18a may function as a cathode, and the second electrode 18c may function as an anode.

The first electrode 18a and the second electrode 18c are insulated from each other by the intermediate layer 18b. When voltages of opposite polarities are respectively applied to the first and second electrodes 18a and 18c, light emission occurs in an organic emission layer of the intermediate layer 18b.

The intermediate layer 18b may include an organic emission layer. The intermediate layer 18b includes an organic emission layer and may further include at least one of a hole injection layer (HIL), a hole transport layer (HTL), an electron transport layer (ETL), and an electron injection layer (EIL), which are common layers.

The intermediate layer 18b may further include various functional layers to assist emission of the light generated in the organic emission layer, in addition to the aforementioned common layers. The functional layers may have improved performance of the organic emission layer, improved brightness and the like, or improved viewing angle.

A plurality of sub pixels may constitute a unit pixel. Such a plurality of sub-pixels may emit light of various colors. For example, a unit pixel may include a plurality of sub-pixels which respectively emit a red light, a green light, a first blue light, and a second blue light, or a plurality of sub-pixels which respectively emit red light, green light, blue light, and white light.

A blue color may include two colors. For example, a blue color may include a deep blue light and a sky blue light. In this case, the plurality of sub pixels may include sub pixels that emit different blue colors.

The plurality of sub pixels B1, B2, R, and G may include a first blue sub pixel B1, a second blue sub pixel B2, a red sub pixel R, and a green sub pixel G. Each of the first blue sub pixel B1, the second blue sub pixel B2, the red sub pixel R, and the green sub pixel G may include the first electrode 18a, the intermediate layer 18b, and the second electrode 18c.

In this case, the first blue sub pixel B1, the second blue sub pixel B2, the red sub pixel R, and the green sub pixel G may include different intermediate layers 18b. For example, the first blue sub pixel B1 may include a first intermediate layer 18b-1, the second blue sub pixel B2 may include a second intermediate layer 18b-2, the green sub pixel G may include a third intermediate layer 18b-3, and the red sub pixel R may include a fourth intermediate layer 18b-4. The first intermediate layer 18b-1 and the second intermediate layer 18b-2 may both generate colors of the same shade, and the third intermediate layer 18b-3 and the fourth intermediate layer 18b-4 may generated different colors. The third intermediate layer 18b-3 and the fourth intermediate layer 18b-4 may generate different colors from the first intermediate layer 18b-1 and the second intermediate layer 18b-2. For example, the first intermediate layer 18b-1 and the second intermediate layer 18b-2 may respectively generate a sky blue color and a deep blue color. The third intermediate layer 18b-3 may generate a green color, and the fourth intermediate layer 18b-4 may generate a red color. According to another exemplary embodiment, the first intermediate layer 18b-1 and the second intermediate layer 18b-2 may respectively generate a sky blue color and a deep blue color, the third intermediate layer 18b-3 may generate a yellow color, and the fourth intermediate layer 18b-4 may generate a red color. For convenience of explanation, the first intermediate layer 18b-1 and the second intermediate layer 18b-2 respectively configured to generate a sky blue color and a deep blue color, the third intermediate layer 18b-3 configured to generate a green color, and the fourth intermediate layer 18b-4 configured to generate a red color will now be described in detail.

The first intermediate layer 18b-1 and the second intermediate layer 18b-2 may have thicknesses different from the first electrode 18a and the second electrode 18c. For example, the first intermediate layer 18b-1 may be thicker than the second intermediate layer 18b-2. In this case, the first intermediate layer 18b-1 may be configured to generate a blue color having a light-emission peak in a wavelength range of 460 nm to 490 nm. The second intermediate layer 18b-2 may be configured to generate a blue color having a light-emission peak in a wavelength range of 460 nm or less.

The first intermediate layer 18b-1 may include a first blue auxiliary layer 18b-1b and a first blue organic emission layer 18b-1a. The first blue auxiliary layer 18b-1b may include at least one of a first hole injection layer 18b-1c, a first hole transport layer 18b-1d, a first electron injection layer 18b-1i, a first electron transport layer 18b-1h, and a first functional layer 18b-1e.

The second intermediate layer 18b-2 may include a second blue auxiliary layer 18b-2b and a second blue organic emission layer 18b-2a. The second blue auxiliary layer 18b-2b may include at least one of a second hole injection layer 18b-2c, a second hole transport layer 18b-2d, a second electron injection layer 18b-2i, a second electron transport layer 18b-2h, and a second functional layer 18b-2e.

The first blue organic emission layer 18b-1a and the second blue organic emission layer 18b-2a may be formed of the same material. In this case, the first blue organic emission layer 18b-1a and the second blue organic emission layer 18b-2a may include the same dopant. For example, the first blue organic emission layer 18b-1a and the second blue organic emission layer 18b-2a may include a cyan blue dopant or a deep blue dopant.

To form the first intermediate layer 18b-1 and the second intermediate layer 18b-2 to have different thicknesses, at least one of the first blue organic emission layer 18b-1a and the first blue auxiliary layer 18b-1b may have different thicknesses from the second blue organic emission layer 18b-2a and the first blue auxiliary layer 18b-2b, respectively. By selectively adjusting at least one of the first blue organic emission layer 18b-1a and the first blue auxiliary layer 18b-1b to have different thicknesses from the second blue organic emission layer 18b-2a and the first blue auxiliary layer 18b-2b, respectively, the first intermediate layer 18b-1 and the second intermediate layer 18b-2 have different thicknesses. For example, the first blue organic emission layer 18b-1a and the second blue organic emission layer 18b-2a may have the same thickness, and the first blue auxiliary layer 18b-1b and the second blue auxiliary layer 18b-2b may have different thicknesses. The first blue organic emission layer 18b-1a and the second blue organic emission layer 18b-2a may have different thicknesses, and the first blue auxiliary layer 18b-1b and the second blue auxiliary layer 18b-2b may have the same thickness. Also, the first blue organic emission layer 18b-1a and the second blue organic emission layer 18b-2a may have different thicknesses, and the first blue auxiliary layer 18b-1b and the second blue auxiliary layer 18b-2b may have different thicknesses.

When the first blue auxiliary layer 18b-1b and the second blue auxiliary layer 18b-2b are formed to have different thicknesses, at least one of the first hole injection layer 18b-1c, the first hole transport layer 18b-1d, the first electron injection layer 18b-1i, the first electron transport layer 18b-1h, and the first functional layer 18b-1e may be adjusted to have different thickness from at least one of the thicknesses of the second hole injection layer 18b-2c, the second hole transport layer 18b-2d, the second electron injection layer 18b-2i, the second electron transport layer 18b-2h, and the second functional layer 18b-2e, respectively. For convenience of description, the first blue organic emission layer 18b-1a and the second blue organic emission layer 18b-2a formed to have the same thickness and the first blue auxiliary layer 18b-1b and the second blue auxiliary layer 18b-2b formed to have different thicknesses will now be described in detail.

The first functional layer 18b-1e may include a first sub functional layer 18b-1f disposed on the first hole transport layer 18b-1d, and a second sub functional layer 18b-1g disposed on the first sub functional layer 18b-1f. The first sub functional layer 18b-1f and the second functional layer 18b-2e may have the same thickness. The first sub functional layer 18b-1f and the second functional layer 18b-2e may be disposed simultaneously. The second sub functional layer 18b-1g and the first sub functional layer 18b-1f may be formed of the same material or different materials.

When the first functional layer 18b-1e and the second functional layer 18b-2e are formed as described above, the first intermediate layer 18b-1 may be thicker than the second intermediate layer 18b-2. Accordingly, respective wavelengths of light emitted by the first intermediate layer 18b-1 and the second intermediate layer 18b-2 may be different from each other due to a resonance effect or the like. Accordingly, by forming the first functional layer 18b-1e and the second functional layer 18b-2e as described above, light having different wavelengths may be generated via the first blue organic emission layer 18b-1a and the second blue organic emission layer 18b-2a formed of the same material.

The third intermediate layer 18b-3 and the fourth intermediate layer 18b-4 may be formed in a similar manner to the first intermediate layer 18b-1 and the second intermediate layer 18b-2. The third intermediate layer 18b-3 may include a green organic emission layer 18b-3a, and the fourth intermediate layer 18b-4 may include a red organic emission layer 18b-4a. Similar to the first intermediate layer 18b-1, the third intermediate layer 18b-3 may further include at least one of a third hole injection layer 18b-3c, a third hole transport layer 18b-3d, a third electron injection layer 18b-3i, a third electron transport layer 18b-3h, and a third functional layer 18b-3e.

The fourth intermediate layer 18b-4 may further include at least one of a fourth hole injection layer 18b-4c, a fourth hole transport layer 18b-4d, a fourth electron injection layer 18b-4i, a fourth electron transport layer 18b-4h, and a fourth functional layer 18b-4e.

In this case, the third intermediate layer 18b-3 and the fourth intermediate layer 18b-4 may have different thicknesses. For example, the fourth intermediate layer 18b-4 may be thicker than the third intermediate layer 18b-3.

To form the third intermediate layer 18b-3 and the fourth intermediate layer 18b-4 to have different thicknesses, at least one layer included in the third intermediate layer 18b-3 and at least one corresponding layer included in the fourth intermediate layer 18b-4 may be formed to have different thicknesses.

By forming the third intermediate layer 18b-3 and the fourth intermediate layer 18b-4 to have different thicknesses as described above, the red sub pixel R and the green sub pixel G may be able to generate light with optimized or improved energy efficiency.

The thin-film encapsulation layer E may include a plurality of inorganic layers or include an inorganic layer and an organic layer.

The organic layer of the thin-film encapsulation layer E is formed of a polymer and may be a single layer or a layer stack including at least one of polyethylene terephthalate (PET), PI, polycarbonate (PC), epoxy, polyethylene, and polyacrylate. The organic layer may include polyacrylate. In detail, the organic layer may be formed by polymerizing a monomer composition including a diacrylate-based monomer and a triacrylate-based monomer. The monomer composition may further include monoacrylate-based monomer. The monomer composition may further include a well-known photoinitiator such as an 2,4,6-trimethyl benzoyl diphenyl phosphine oxide (TPO), but the exemplary embodiments are not limited thereto.

The inorganic layer of the thin-film encapsulation layer E may be a single layer or a layer stack including at least one of metal oxide and metal nitride. In detail, the inorganic layer may include at least one of $SiN_x$, $Al_2O_3$, $SiO_2$, and $TiO_2$.

An uppermost layer exposed to the outside in the thin-film encapsulation layer E may be formed of an inorganic layer to prevent or reduce infiltration of moisture to the OLED 18.

The thin-film encapsulation layer E may include at least one sandwich structure in which at least one organic layer is interposed between at least two inorganic layers. The thin-film encapsulation layer E may include at least one sandwich structure in which at least one inorganic layer is interposed between at least two organic layers. The thin-film encapsulation layer E may include a sandwich structure in which at least one organic layer is interposed between at least two inorganic layers and a sandwich structure in which at least one inorganic layer is interposed between at least two organic layers.

For example, the thin-film encapsulation layer E may include a first inorganic layer, a first organic layer, and a second inorganic layer sequentially disposed from an upper portion of the OLED 18. The thin-film encapsulation layer E may include a first inorganic layer, a first organic layer, a second inorganic layer, a second organic layer, and a third inorganic layer sequentially disposed from the upper portion of the OLED 18. The thin-film encapsulation layer E may also include a first inorganic layer, a first organic layer, a second inorganic layer, a second organic layer, a third inorganic layer, a third organic layer, and a fourth inorganic layer sequentially formed starting from the upper portion of the OLED 18.

A halogenated metal layer including lithium fluoride (LiF) may be further included between the OLED 18 and the first inorganic layer. The halogenated metal layer may prevent or reduce damage to the OLED 18 when forming the first inorganic layer by sputtering.

The first organic layer may have a smaller area than the second inorganic layer, and the second organic layer may also have a smaller area than the third inorganic layer.

Accordingly, the display apparatus 10 according to the exemplary embodiments may generate blue colors having two wavelengths by forming the first and second intermediate layers 18b-1 and 18b-2 of the first and second blue sub pixels B1 and B2 to have different thicknesses as described above.

The display apparatus 10 configured to generate blue colors having two wavelengths may have effects, such as wake-up light alarm and sleep promoting light.

The display apparatus 10 is configured to generate blue colors having two wavelengths via a structure including intermediate layers having different thicknesses as described above.

Figure 5:
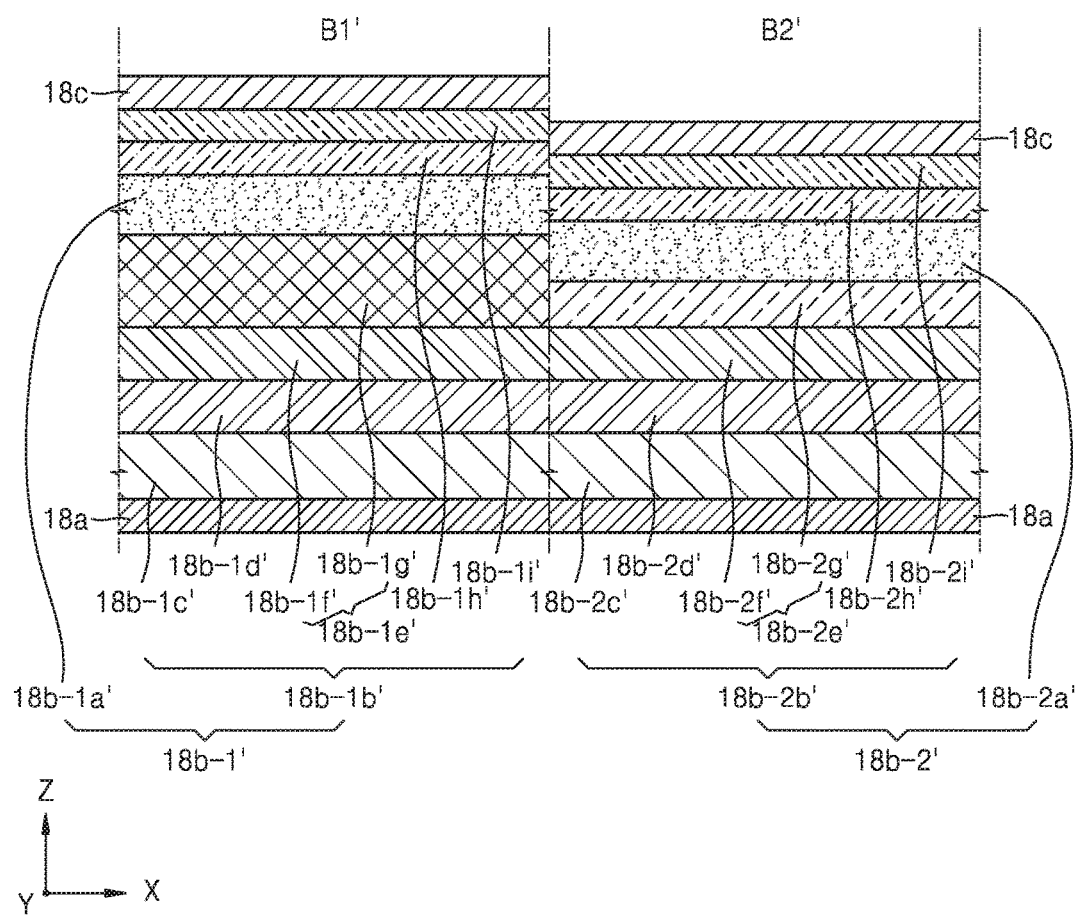
FIG. 5 is a cross-sectional view of a first blue sub pixel and a second blue sub pixel of the display apparatus of FIG. 1, according to a second exemplary embodiment.

FIG. 5 is a cross-sectional view of a first blue sub pixel B1' and a second blue sub pixel B2' of the display apparatus 10 of FIG. 1, according to a second exemplary embodiment.

Referring to FIG. 5, a plurality of sub pixels may include the first blue sub pixel B1', the second blue sub pixel B2', a green sub pixel, and a red sub pixel. In this case, the first blue sub pixel B1' may include a first intermediate layer 18b-1', the second blue sub pixel B2' may include a second intermediate layer 18b-2', the green sub pixel may include a third intermediate layer, and the red sub pixel may include a fourth intermediate layer. The third and fourth intermediate layers are substantially the same as or similar to the third and fourth intermediate layers 18b-3 and 18b-4 illustrated in FIG. 4, and thus a detailed description thereof is omitted herein.

The first intermediate layer 18b-1' may include a first blue organic emission layer 18b-1a' and a first blue auxiliary layer 18b-1b'. The first blue organic emission layer 18b-1a' is substantially the same as or similar to the first blue organic emission layer 18b-1a illustrated in FIG. 4, and thus a detailed description thereof is omitted herein.

The first blue auxiliary layer 18b-1b' may include at least one of a first hole injection layer 18b-1c', a first hole transport layer 18b-1d', a first electron injection layer 18b-1i', a first electron transport layer 18b-1h', and a first functional layer 18b-1e'.

The second intermediate layer 18b-2' may include a second blue organic emission layer 18b-2a' and a second blue auxiliary layer 18b-2b'. The second blue organic emission layer 18b-2a' is substantially the same as or similar to the second blue organic emission layer 18b-2a illustrated in FIG. 4, and thus a detailed description thereof is omitted herein.

The second blue auxiliary layer 18b-2b' may include at least one of a second hole injection layer 18b-2c', a second hole transport layer 18b-2d', a second electron injection layer 18b-2i', a second electron transport layer 18b-2h', and a second functional layer 18b-2e'.

The first intermediate layer 18b-1' and the second intermediate layer 18b-2' may have different thicknesses. In this case, the first intermediate layer 18b-1' and the second intermediate layer 18b-2' may have different thicknesses by adjusting the thickness of at least one of the layers that constitute the first and second intermediate layers 18b-1' and 18b-2' as described above. However, for convenience of description, the first intermediate layer 18b-1' and the second intermediate layer 18b-2' including the first functional layer 18b-1e' and the second functional layer 18b-2e' having different thicknesses will now be described in detail.

The first functional layer 18b-1e' may include a first sub functional layer 18b-1f and a second sub functional layer 18b-1g'. The second functional layer 18b-2e' may include a third sub functional layer 18b-2f and a fourth sub functional layer 18b-2g'. The first sub functional layer 18b-1f and the third sub functional layer 18b-2f may have the same thickness. In particular, the first sub functional layer 18b-1f and the third sub functional layer 18b-2f may have the same thickness according to the same process.

The second sub functional layer 18b-1g' and the fourth sub functional layer 18b-2g' may have different thicknesses. In this case, the second sub functional layer 18b-1g' may be thicker than the fourth sub functional layer 18b-2g'.

Accordingly, a display apparatus according to the exemplary embodiments may generate blue colors having two wavelengths by forming the first and second intermediate layers 18b-1' and 18b-2' of the first and second blue sub pixels B1' and B2' to have different thicknesses as described above.

The display apparatus 10 configure to generate blue colors having two wavelengths may have effects that may be used for wake-up light alarm and/or sleep promoting light.

The display apparatus is configured to generate blue colors having two wavelengths via a structure including intermediate layers having different thicknesses as described above.

Figure 6:
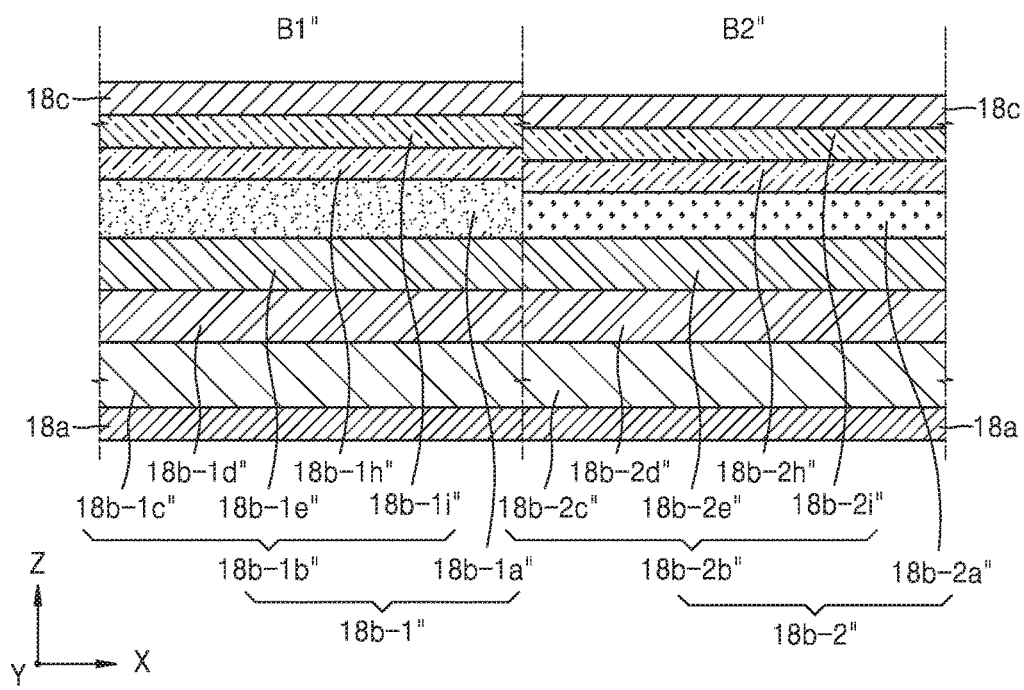
FIG. 6 is a cross-sectional view of a first blue sub pixel and a second blue sub pixel of the display apparatus of FIG. 1, according to a third exemplary embodiment.

FIG. 6 is a cross-sectional view of a first blue sub pixel B1" and a second blue sub pixel B2" of the display apparatus 10 of FIG. 1, according to a third exemplary embodiment.

Referring to FIG. 6, a plurality of sub pixels may include a first blue sub pixel B1", a second blue sub pixel B2", a green sub pixel, and a red sub pixel. In this case, the first blue sub pixel B1" may include a first intermediate layer 18b-1", the second blue sub pixel B2" may include a second intermediate layer 18b-2", the green sub pixel may include a third intermediate layer, and the red sub pixel may include a fourth intermediate layer. The third and fourth intermediate layers are substantially the same as or similar to the third and fourth intermediate layers 18b-3 and 18b-4 illustrated in FIG. 4, and thus a detailed description thereof is omitted herein.

The first intermediate layer 18b-1" may include a first blue organic emission layer 18b-1a" and a first blue auxiliary layer 18b-1b". The first blue auxiliary layer 18b-1b" may include at least one of a first hole injection layer 18b-1c", a first hole transport layer 18b-1d", a first electron injection layer 18b-1i", a first electron transport layer 18b-1h", and a first functional layer 18b-1e".

The second intermediate layer 18b-2" may include a second blue organic emission layer 18b-2a" and a second blue auxiliary layer 18b-2b". The second blue auxiliary layer 18b-2b" may include at least one of a second hole injection layer 18b-2c", a second hole transport layer 18b-2d", a second electron injection layer 18b-2i", a second electron transport layer 18b-2h", and a second functional layer 18b-2e".

The first blue organic emission layer 18b-1a" and the second blue organic emission layer 18b-2a" may include different materials. For example, the first blue organic emission layer 18*b*-1*a*" may include a material having a light-emission peak within a photoluminescence wavelength range of 460 nm to 480 nm. The second blue organic emission layer 18*b*-2*a*" may include a material having a light-emission peak within a photoluminescence wavelength range of 440 nm to 460 nm.

In detail, the first blue organic emission layer 18*b*-1*a*" includes a sky blue dopant. Examples of the sky blue dopant may include p-bis(p-N,N-diphenyl-aminostyryl)-benzene (DSA-Ph), which is a di(styryl)amine-based blue dopant, and phenyl cyclopentadiene.

The second blue organic emission layer 18*b*-2*a*" includes a deep blue dopant. Examples of the deep blue dopant may include 4'-N,Ndiphenylaminostyryl-triphenyl (DPA-TP), 2,5,2',5'-tetrastyryl-biphenyl (TSB), and an anthracene-based derivative.

The first intermediate layer 18*b*-1" and the second intermediate layer 18*b*-2" may also have different thicknesses. For example, the first intermediate layer 18*b*-1" may be thicker than the second intermediate layer 18*b*-2". The thickness of each of the first and second intermediate layers 18*b*-1" and 18*b*-2" may be a distance between an upper surface of a first electrode 18*a*, on which the first and second intermediate layers 18*b*-1" and 18*b*-2" are disposed, and a lower surface of the second electrode 18*c*.

The first intermediate layer 18*b*-1" and the second intermediate layer 18*b*-2" may have different thicknesses by adjusting the thickness of at least one of a plurality of layers that constitute each of the first and second intermediate layers 18*b*-1" and 18*b*-2". For example, to form the first intermediate layer 18*b*-1" and the second intermediate layer 18*b*-2" to have different thicknesses, at least one of the thickness of the first blue organic emission layer 18*b*-1*a*", the thickness of the first hole injection layer 18*b*-1*c*", the thickness of the first hole transport layer 18*b*-1*d*", the thickness of the first electron injection layer 18*b*-1*i*", the thickness of the first electron transport layer 18*b*-1*h*", and the thickness of the first functional layer 18*b*-1*e*" may be adjusted. The thickness may be adjusted by controlling at least one of a deposition speed and a deposition time of deposition process for at least one of the first blue organic emission layer 18*b*-1*a*", the first hole injection layer 18*b*-1*c*", the first hole transport layer 18*b*-1*d*", the first electron injection layer 18*b*-1*i*", the first electron transport layer 18*b*-1*h*", and the first functional layer 18*b*-1*e*". For example, to form the first intermediate layer 18*b*-1" and the second intermediate layer 18*b*-2" to have different thicknesses, at least one of the thickness of the second blue organic emission layer 18*b*-2*a*", the thickness of the second hole injection layer 18*b*-2*c*", the thickness of the second hole transport layer 18*b*-2*d*", the thickness of the second electron injection layer 18*b*-2*i*", the thickness of the second electron transport layer 18*b*-2*h*", and the thickness of the second functional layer 18*b*-2*e*" may be adjusted. The thickness of the second intermediate layer 18*b*-2" may adjusted using a method the same as or similar to the above-described method of adjusting the thickness of the first intermediate layer 18*b*-1".

For convenience of explanation, the first intermediate layer 18*b*-1" and the second intermediate layer 18*b*-2" respectively including the first blue organic emission layer 18*b*-1*a*" and the second blue organic emission layer 18*b*-2*a*" having different thicknesses will now be described in detail. The first blue organic emission layer 18*b*-1*a*" and the second blue organic emission layer 18*b*-2*a*" may be formed of different materials.

The first blue organic emission layer 18*b*-1*a*" and the second blue organic emission layer 18*b*-2*a*" may have different thicknesses. In detail, the first blue organic emission layer 18*b*-1*a*" may be thicker than the second blue organic emission layer 18*b*-2*a*".

The first blue organic emission layer 18*b*-1*a*" and the second blue organic emission layer 18*b*-2*a*" may be configured to generate distinctly different blue colors, respectively, by including different materials.

In this case, the first blue organic emission layer 18*b*-1*a*" and the second blue organic emission layer 18*b*-2*a*" may emit light simultaneously, or the first blue organic emission layer 18*b*-1*a*" and the second blue organic emission layer 18*b*-2*a*" selectively emit light, to generate various types of blue color for users.

Accordingly, the display apparatus 10 according to the exemplary embodiments may generate blue colors having two wavelengths by forming the first and second intermediate layers 18*b*-1*a*" and 18*b*-2*a*" to have different thicknesses as described above.

The display apparatus 10 configured generated blue colors having two wavelengths may have effects that may be used for wake-up light alarm and/or sleep promoting light.

The display apparatus is configured to generate blue colors having two wavelengths via a structure including intermediate layers having different thicknesses as described above.

Figure 7:
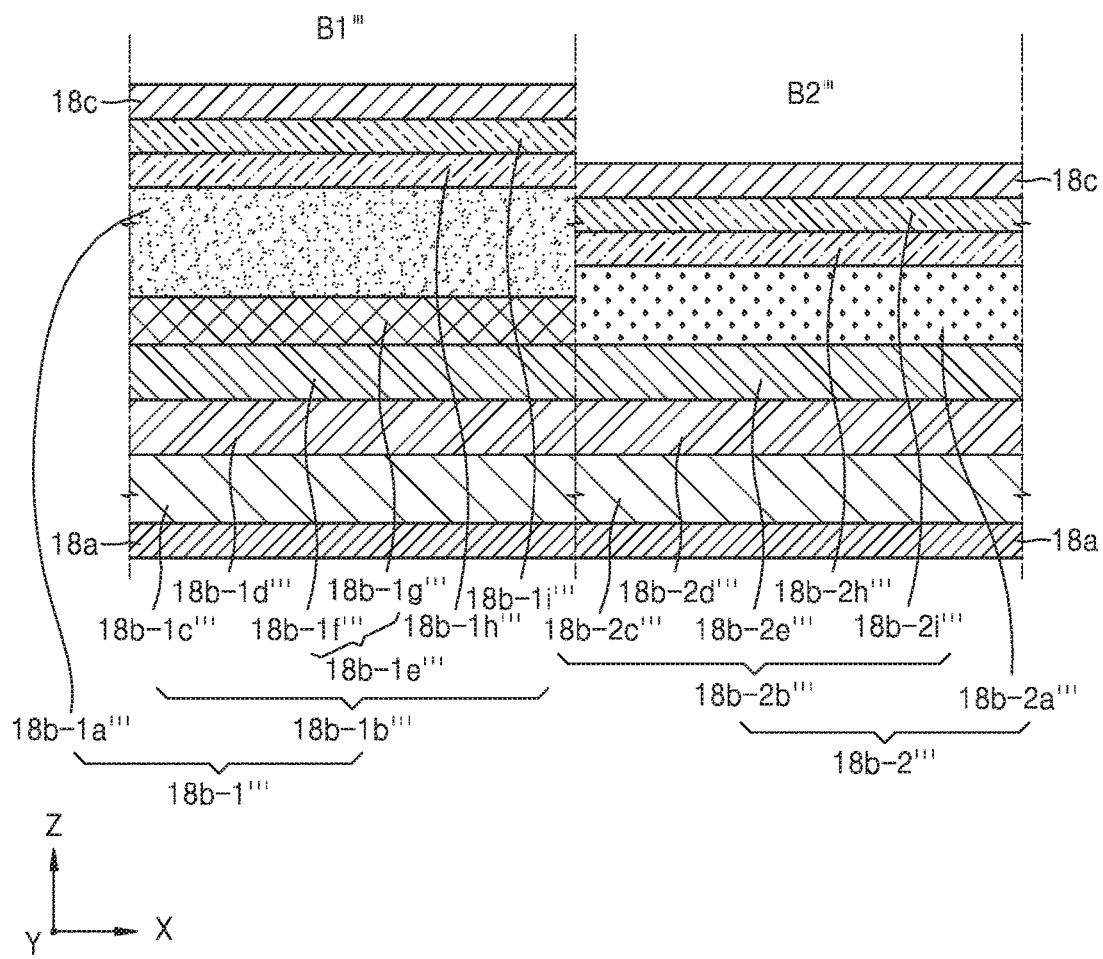
FIG. 7 is a cross-sectional view of a first blue sub pixel and a second blue sub pixel of the display apparatus of FIG. 1, according to a fourth exemplary embodiment.

FIG. 7 is a cross-sectional view of a first blue sub pixel B1''' and a second blue sub pixel B2''' of the display apparatus 10 of FIG. 1, according to a fourth embodiment.

Referring to FIG. 7, a plurality of sub pixels may include a first blue sub pixel B1''', a second blue sub pixel B2''', a green sub pixel, and a red sub pixel. In this case, the first blue sub pixel B1''' may include a first intermediate layer 18*b*-1''', the second blue sub pixel B2''' may include a second intermediate layer 18*b*-2''', the green sub pixel may include a third intermediate layer, and the red sub pixel may include a fourth intermediate layer. The third and fourth intermediate layers are substantially the same as or similar to the third and fourth intermediate layers 18*b*-3 and 18*b*-4 illustrated in FIG. 4, and thus a detailed description thereof is omitted herein.

The first intermediate layer 18*b*-1''' may include a first blue organic emission layer 18*b*-1*a*" and a first blue auxiliary layer 18*b*-1*b*'''. The first blue auxiliary layer 18*b*-1*b*''' may include at least one of a first hole injection layer 18*b*-1*c*''', a first hole transport layer 18*b*-1*d*''', a first electron injection layer 18*b*-1*i*''', a first electron transport layer 18*b*-1*h*''', and a first functional layer 18*b*-1*e*'''.

The second intermediate layer 18*b*-2''' may include a second blue organic emission layer 18*b*-2*a*" and a second blue auxiliary layer 18*b*-2*b*". The second blue auxiliary layer 18*b*-2*b*''' may include at least one of a second hole injection layer 18*b*-2*c*''', a second hole transport layer 18*b*-2*d*''', a second electron injection layer 18*b*-2*i*''', a second electron transport layer 18*b*-2*h*''', and a second functional layer 18*b*-2*e*'''.

The first intermediate layer 18*b*-1''' and the second intermediate layer 18*b*-2" may have different thicknesses. To form the first intermediate layer 18*b*-1''' and the second intermediate layer 18*b*-2''' to have different thicknesses, at least one of the thickness of the first blue organic emission layer 18*b*-1*a*''', the thickness of the first hole injection layer 18*b*-1*c*''', the thickness of the first hole transport layer 18*b*-1*d*''', the thickness of the first electron injection layer 18*b*-1*i*''', the thickness of the first electron transport layer 18*b*-1*h*''', and the thickness of the first functional layer 18b-1e''' may be adjusted. Also, to form the first intermediate layer 18b-1''' and the second intermediate layer 18b-2''' to have different thicknesses, at least one of the thickness of the second blue organic emission layer 18b-2a''', the thickness of the second hole injection layer 18b-2c''', the thickness of the second hole transport layer 18b-2e''', the thickness of the second electron injection layer 18b-2i''', the thickness of the second electron transport layer 18b-2h''', and the thickness of the second functional layer 18b-2e''' may be adjusted. For convenience of description, the first blue organic emission layer 18b-1a''' and the second blue organic emission layer 18b-2a''' having different thicknesses and the first functional layer 18b-1e''' and the second functional layer 18b-2e''' having different thicknesses will now be described in detail.

The first blue organic emission layer 18b-1a''' and the second blue organic emission layer 18b-2a''' may include different materials. The materials of the first blue organic emission layer 18b-1a''' and the second blue organic emission layer 18b-2a''' are substantially the same as or similar to the first blue organic emission layer 18b-1a'' and the second blue organic emission layer 18b-2a'' illustrated in FIG. 6, and thus a detailed description thereof is omitted herein.

The first blue organic emission layer 18b-1a''' and the second blue organic emission layer 18b-2a''' may be formed to have different thicknesses. In detail, the first blue organic emission layer 18b-1a''' may be thicker than the second blue organic emission layer 18b-2a'''.

The first functional layer 18b-1e''' may include a first sub functional layer 18b-1f''' and a second sub functional layer 18b-1g'''. The first sub functional layer 18b-1f''' may be disposed between the second sub functional layer 18b-1g''' and the first hole transport layer 18b-1d''. The second sub functional layer 18b-1g''' may be disposed between the first sub functional layer 18b-1f''' and the first blue organic emission layer 18b-1a'''.

The first sub functional layer 18b-1f''' and the second sub functional layer 18b-1g''' may increase luminescence efficiency of the first blue organic emission layer 18b-1a''' or assist light emission thereof.

According to an exemplary embodiment, the first sub functional layer 18b-1f''' and the second sub functional layer 18b-1g''' may be formed as a single layer. In this case, the first sub functional layer 18b-1f''' and the second sub functional layer 18b-1g''' may be formed of the same material. According to an exemplary embodiment, the first sub functional layer 18b-1f''' and the second sub functional layer 18b-1g''' may be formed as different layers. In this case, the first sub functional layer 18b-1f''' and the second sub functional layer 18b-1g''' may be formed of different materials.

For convenience of description, the first sub functional layer 18b-1f''' and the second sub functional layer 18b-1g''' including different materials and formed as different layers will now be described in detail.

According to an exemplary embodiment, the second functional layer 18b-2e''' may have the same thickness as the first sub functional layer 18b-1f'''. The second functional layer 18b-2e''' may be formed simultaneously with the first sub functional layer 18b-1f'''. In particular, the second functional layer 18b-2e''' and the first sub functional layer 18b-1f''' may be formed of the same material. According to an exemplary embodiment, the second sub functional layer 18b-2e''' and the first sub functional layer 18b-1f''' may be formed of different materials. In this case, the second functional layer 18b-2e''' and the first sub functional layer 18b-1f''' may be formed using different processes.

When the first intermediate layer 18b-1''' and the second intermediate layer 18b-2''' are formed as described above, the first intermediate layer 18b-1''' and the second intermediate layer 18b-2''' may generate blue colors having different wavelength ranges. For example, the first intermediate layer 18b-1''' may generate a blue color having a light-emission peak in a wavelength range of 460 nm to 490 nm. The second intermediate layer 18b-2''' may generate a blue color having a light-emission peak in a wavelength range of 460 nm or less.

A current may be selectively applied to the first intermediate layer 18b-1''' and the second intermediate layer 18b-2''' according to an external signal. In particular, the first intermediate layer 18b-1''' and the second intermediate layer 18b-2''' may be controlled to emit only one or both emit light.

Accordingly, a display apparatus 10 according to the exemplary embodiments may generate blue colors having two wavelengths by forming intermediate layers having different thicknesses, as described above.

Moreover, the display apparatus 10 according to the exemplary embodiments may be configured to generate blue colors having two wavelengths that may be used for either promoting alertness or sleep, depending on the wavelength of the blue light.

The display apparatus is configured to generate blue colors having two wavelengths via a structure including intermediate layers having different thicknesses as described above.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus comprising a unit pixel, the unit pixel comprising:
   a first blue sub pixel comprising a first intermediate layer, the first intermediate layer comprising a first blue organic emission layer;
   a second blue sub pixel comprising a second intermediate layer, the second intermediate layer comprising a second blue organic emission layer;
   a green sub pixel comprising a third intermediate layer, the third intermediate layer comprising a green organic emission layer; and
   a red sub pixel comprising a fourth intermediate layer, the fourth intermediate layer comprising a red organic emission layer,
   wherein each of the first blue sub pixel, the second blue sub pixel, the red sub pixel, and the green sub pixel comprises a first electrode and a second electrode, the first intermediate layer, the second intermediate layer, the third intermediate layer, and the fourth intermediate layer respectively disposed interposing the first electrode and the second electrode,
   wherein the first intermediate layer and the second intermediate layer have different thicknesses, and the third intermediate layer and the fourth intermediate layer have different thicknesses,
   wherein the first intermediate layer comprises a first blue auxiliary layer, and the second intermediate layer comprises a second blue auxiliary layer, wherein the first blue auxiliary layer comprises at least one sub layer additional to the same structure of the second blue auxiliary layer, and wherein the first blue sub pixel is configured to generate a sky blue color and the second blue sub pixel is configured to generate a deep blue color.

2. The display apparatus of claim 1, wherein a thickness of the first intermediate layer is greater than a thickness of the second intermediate layer.

3. The display apparatus of claim 1, wherein the first blue auxiliary layer is disposed between the first blue organic emission layer and the first electrode, between the first blue organic emission layer and the second electrode, or both between the first blue organic emission layer and the first electrode and between the first blue organic emission layer and the second electrode, and the second blue auxiliary layer is disposed between the second blue organic emission layer and the first electrode, between the second blue organic emission layer and the second electrode, or both between the second blue organic emission layer and the first electrode and between the second blue organic emission layer and the second electrode.

4. The display apparatus of claim 3, wherein a thickness of the first blue auxiliary layer is different from a thickness of the second blue auxiliary layer.

5. The display apparatus of claim 4, wherein a thickness of the first blue organic emission layer is same as a thickness of the second blue organic emission layer.

6. The display apparatus of claim 4, wherein a thickness of the first blue organic emission layer is different from a thickness of the second blue organic emission layer.

7. The display apparatus of claim 3, wherein the first blue auxiliary layer comprises at least one of a first hole injection layer, a first hole transport layer, a first electron injection layer, a first electron transport layer, and a first functional layer.

8. The display apparatus of claim 3, wherein the second blue auxiliary layer comprises at least one of a second hole injection layer, a second hole transport layer, a second electron injection layer, a second electron transport layer, and a second functional layer.

9. The display apparatus of claim 3, wherein a thickness of the first blue organic emission layer is different from a thickness of the second blue organic emission layer.

10. The display apparatus of claim 9, wherein the thickness of the first blue auxiliary layer is same as the thickness of the second blue auxiliary layer.

11. The display apparatus of claim 1, wherein the first blue organic emission layer and the second blue organic emission layer are formed of a same material.

12. The display apparatus of claim 1, wherein the first blue organic emission layer and the second blue organic emission layer comprise different materials.

13. The display apparatus of claim 12, wherein the first blue organic emission layer comprises a material having a light-emission peak within a photoluminescence wavelength range of 460 nm to 480 nm.

14. The display apparatus of claim 12, wherein the second blue organic emission layer comprises a material having a light-emission peak within a photoluminescence wavelength range of 440 nm to 460 nm.

15. The display apparatus of claim 1, wherein, when a current is applied, the first intermediate layer and the second intermediate layer are configured to emit light with wavelengths having different light-emission peaks, respectively.

16. The display apparatus of claim 15, wherein the first intermediate layer emits a blue color having a light-emission peak within a photoluminescence wavelength range of 460 nm to 490 nm.

17. The display apparatus of claim 15, wherein the second intermediate layer emits a blue color having a light-emission peak within a photoluminescence wavelength range of 460 nm or less.

18. A display apparatus that comprises a unit pixel, the unit pixel comprising:

a first blue sub pixel comprising a first blue organic emission layer and a first blue auxiliary layer;

a second blue sub pixel comprising a second blue organic emission layer and a second blue auxiliary layer;

a green sub pixel comprising a green organic emission layer and a green auxiliary layer; and a red sub pixel comprising a red organic emission layer and a red auxiliary layer, wherein each of the first blue sub pixel, the second blue sub pixel, the red sub pixel, and the green sub pixel comprises a first electrode and a second electrode, the first blue organic emission layer and the first blue auxiliary layer, the second blue organic emission layer and the second auxiliary layer, the green organic emission layer and the green auxiliary layer, and the red organic emission layer and the red auxiliary layer respectively disposed between the first electrode and the second electrode, wherein the first blue auxiliary layer and the second blue auxiliary layer have different thicknesses, wherein the first blue auxiliary layer comprises at least one sub layer additional to the same structure of the second blue auxiliary layer, wherein the first electrode and the second electrode of the first blue sub pixel respectively have the same structure as the first electrode and the second electrode of the second blue sub pixel, wherein the first blue organic emission layer and the second blue organic emission layer are formed of a same material, and wherein the first blue sub pixel is configured to generate a sky blue color and the second blue sub pixel is configured to generate a deep blue color.

19. A display apparatus comprising a unit pixel, the unit pixel comprising:

a first blue sub pixel comprising a first intermediate layer, the first intermediate layer comprising a first blue organic emission layer;

a second blue sub pixel comprising a second intermediate layer, the second intermediate layer comprising a second blue organic emission layer;

a green sub pixel comprising a third intermediate layer, the third intermediate layer comprising a green organic emission layer; and a red sub pixel comprising a fourth intermediate layer, the fourth intermediate layer comprising a red organic emission layer, wherein each of the first blue sub pixel, the second blue sub pixel, the red sub pixel, and the green sub pixel comprises a first electrode and a second electrode, and the first intermediate layer, the second intermediate layer, the third intermediate layer, and the fourth intermediate layer are respectively disposed interposing the first electrode and the second electrode therebetween, wherein the first intermediate layer and the second intermediate layer have different thicknesses, and the third intermediate layer and the fourth intermediate layer have different thicknesses, and wherein the first blue sub pixel and the second blue sub pixel have different thicknesses.

20. The display apparatus of claim 19, wherein the first electrode of the first blue sub pixel and the first electrode of the second sub pixel have a same thickness.

* * * * *